(12) United States Patent
Tsutsumi et al.

(10) Patent No.: US 8,334,547 B2
(45) Date of Patent: Dec. 18, 2012

(54) LIGHT-TRANSMITTING METAL ELECTRODE HAVING HYPERFINE STRUCTURE AND PROCESS FOR PREPARATION THEREOF

(75) Inventors: Eishi Tsutsumi, Kawasaki (JP); Akira Fujimoto, Kawasaki (JP); Koji Asakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 12/187,653

(22) Filed: Aug. 7, 2008

(65) Prior Publication Data
US 2009/0079322 A1   Mar. 26, 2009

(30) Foreign Application Priority Data
Sep. 21, 2007   (JP) ................. 2007-245167

(51) Int. Cl.
*H01L 33/00* (2010.01)
(52) U.S. Cl. .............. 257/99; 257/E33.067
(58) Field of Classification Search .......... 257/81, 257/99, 94, E33.067, E33.068; 313/348, 313/360.1, 505
See application file for complete search history.

(56) References Cited

U.S. PATENT DOCUMENTS

| | | | |
|---|---|---|---|
| 6,054,809 A * | 4/2000 | Haynes et al. .......... 313/505 |
| 6,198,051 B1 | 3/2001 | Moshrefzadeh et al. |
| 6,258,618 B1 * | 7/2001 | Lester .................... 438/46 |
| 6,285,020 B1 * | 9/2001 | Kim et al. .............. 250/216 |
| 6,565,763 B1 | 5/2003 | Asakawa et al. |
| 7,029,727 B1 | 4/2006 | Kokura et al. |
| 7,033,936 B1 * | 4/2006 | Green .................... 438/669 |
| 2003/0160557 A1 * | 8/2003 | Chen et al. ............ 313/310 |
| 2004/0012013 A1 * | 1/2004 | Katayama .............. 257/13 |
| 2006/0112987 A1 | 6/2006 | Nakata et al. |
| 2006/0170333 A1 | 8/2006 | Ishihara et al. |
| 2006/0245464 A1 * | 11/2006 | Hori et al. ............. 372/99 |
| 2007/0057266 A1 * | 3/2007 | Wang et al. ............ 257/89 |
| 2007/0183035 A1 | 8/2007 | Asakawa et al. |

(Continued)

FOREIGN PATENT DOCUMENTS
EP   0 534 467 A1   3/1993
(Continued)

OTHER PUBLICATIONS
U.S. Appl. No. 12/706,338, filed Feb. 16, 2010, Nakanishi, et al.
(Continued)

*Primary Examiner* — Matthew Landau
*Assistant Examiner* — Latanya N Crawford
(74) *Attorney, Agent, or Firm* — Oblon, Spivak, McClelland, Maier & Neustadt, L.L.P.

(57) ABSTRACT

The present invention provides a metal electrode transparent to light. The metal electrode comprises a transparent substrate and a metal electrode layer composed of a metal part and plural openings. The metal electrode layer continues without breaks, and 90% or more of the metal part continues linearly without breaks by the openings in a straight length of not more than ⅓ of the visible wavelength to use in 380 nm to 780 nm. The openings have an average diameter in the range of not less than 10 nm and not more than ⅓ of the wavelength of incident light, and the pitches between the centers of the openings are not less than the average diameter and not more than ½ of the wavelength of incident light. The metal electrode layer has a thickness in the range of not less than 10 nm and not more than 200 nm.

10 Claims, 3 Drawing Sheets

U.S. PATENT DOCUMENTS

| | | | |
|---|---|---|---|
| 2009/0007955 A1* | 1/2009 | Nakashima et al. | 136/244 |
| 2009/0213367 A1* | 8/2009 | Green | 356/244 |
| 2009/0236962 A1* | 9/2009 | Fujimoto et al. | 313/348 |
| 2009/0242925 A1* | 10/2009 | Kitagawa et al. | 257/99 |
| 2010/0020046 A1* | 1/2010 | Nihei et al. | 345/204 |
| 2010/0065868 A1* | 3/2010 | Kitagawa et al. | 257/98 |
| 2010/0127635 A1* | 5/2010 | Yao | 315/291 |
| 2010/0175749 A1* | 7/2010 | Tsutsumi et al. | 136/256 |
| 2010/0236620 A1* | 9/2010 | Nakanishi et al. | 136/256 |

FOREIGN PATENT DOCUMENTS

| | | |
|---|---|---|
| JP | 11-72607 | 3/1999 |
| JP | 2005-279807 | 10/2005 |
| JP | 2005-332705 | 12/2006 |

OTHER PUBLICATIONS

U.S. Appl. No. 12/700,063, filed Feb. 4, 2010, Tsutsumi, et al.

Christopher Harrison, et al., "Dynamics of pattern coarsening in a two-dimensional smectic system", Physical Review E 66, 011706, 2002, pp. 011706-1-011706-27.

C.Genet, et al., "Light in tiny holes", Nature, vol. 445, doi:10.1038/nature05350, Jan. 4, 2007, pp. 39-46.

U.S. Appl. No. 12/875,809, filed Sep. 3, 2010, Iida, et al.

U.S. Appl. No. 13/216,977, filed Aug. 24, 2011, Masunaga, et al.

U.S. Appl. No. 13/221,319, filed Aug. 30, 2011, Masunaga, et al.

U.S. Appl. No. 13/222,281, filed Aug. 31, 2011, Asakawa et al.

* cited by examiner

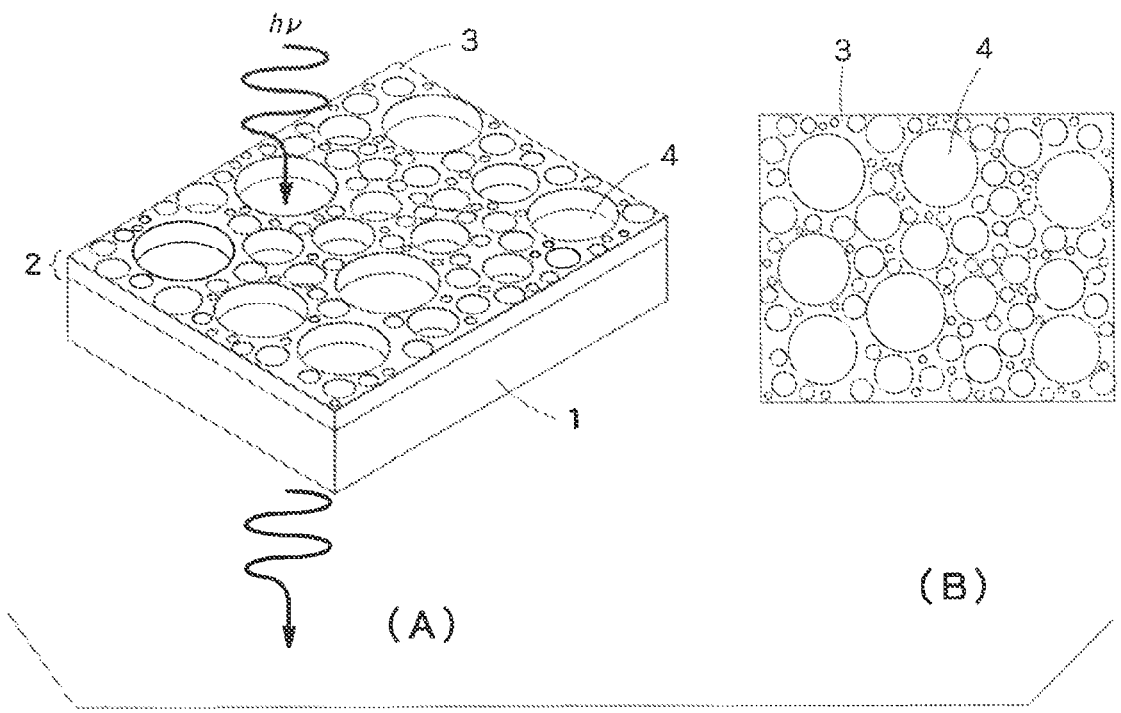
F I G. 1
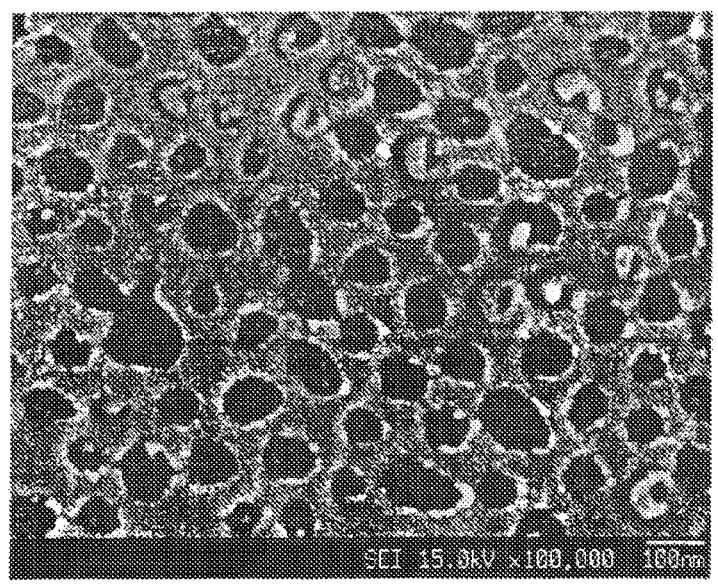
F I G. 2

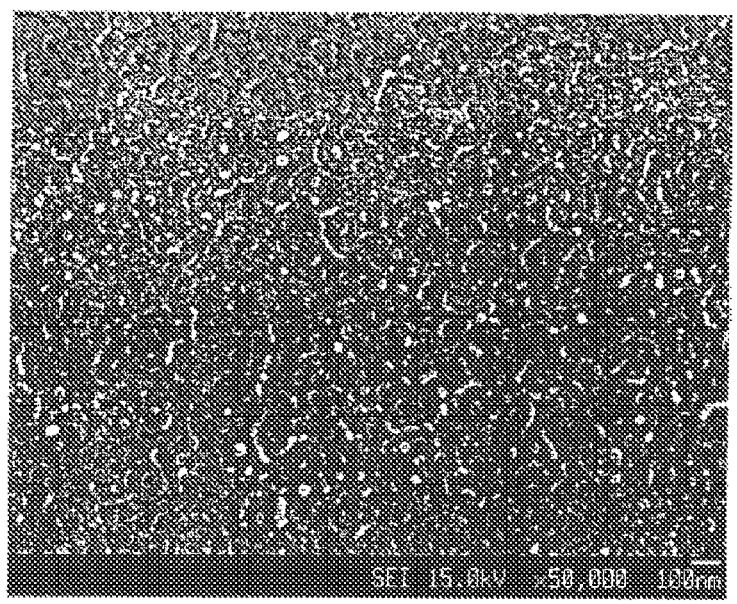
F I G. 4
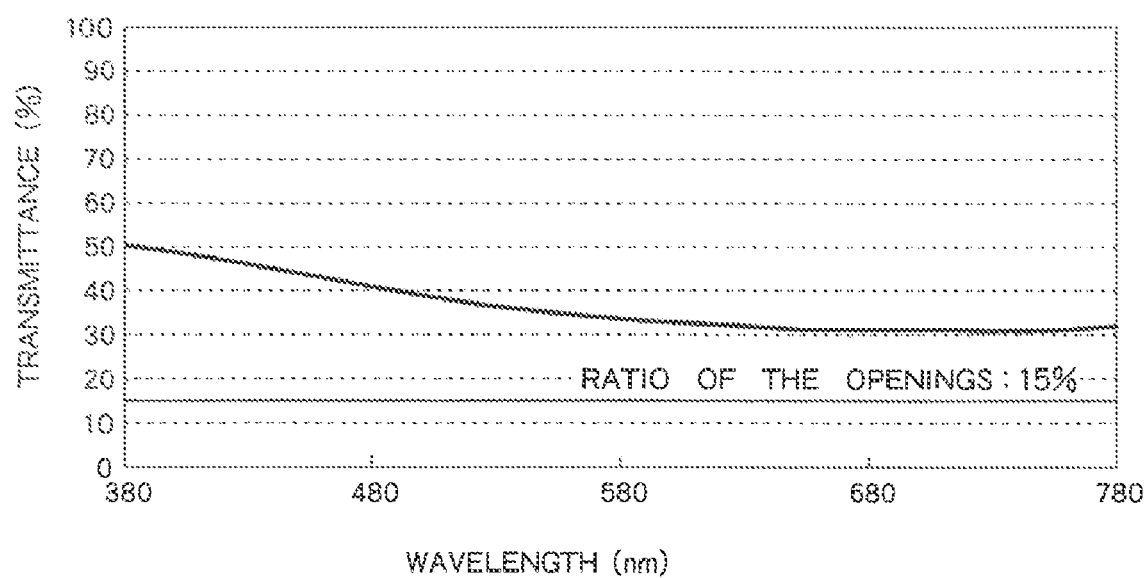
F I G. 5

LIGHT-TRANSMITTING METAL ELECTRODE HAVING HYPERFINE STRUCTURE AND PROCESS FOR PREPARATION THEREOF

CROSS-REFERENCE TO RELATED APPLICATIONS

This application is based upon and claims the benefit of priority from the prior Japanese Patent Applications No. 245167/2007, filed on Sep. 21, 2007; the entire contents of which are incorporated herein by reference.

BACKGROUND OF THE INVENTION

1. Field of the Invention

The present invention relates to a light-transmitting metal electrode. In detail, the invention relates to a light-transmission metal electrode having a hyperfine structure. The invention also relates to a process for preparation of the light-transmitting metal electrode.

2. Background Art

Light-transmitting electrodes, which have light transparency particularly in the visible region and at the same time which function as electrodes, are widely used in electronics industries. For example, all the displays distributed currently in markets, except displays of cathode ray tube (CRT) type, need light-transmitting electrodes since they adopt electric driving systems. According as flat panel displays typically such as liquid crystal displays and plasma displays have been explosively getting popular in recent years, the demand for light-transmitting electrodes has been rapidly increasing.

In early studies of electrodes that transmit light, the electrodes were mainly made of a metal such as Au, Ag, Pt, Cu, Rh, Pd or Cr in the form of such very thin foil having a thickness of 3 to 15 nm that the metal foil could have light transparency to a certain degree. When used, for example, the thin metal foil was put between transparent dielectric layers for improving durability. However, since the foil was made of a metal, there was a trade-off relationship between resistivity and light-transmittance and hence it could not have properties satisfying enough to put various devices into practical use. The mainstream study, therefore, shifted to oxide semiconductors. In present, almost all the practical light-transmitting metal electrodes are made of oxide semiconductor materials. For example, indium tin oxide (hereinafter, referred to as "ITO"), which is indium oxide containing tin as a dopant, is generally used.

However, as described below in detail, the trade-off relationship between resistivity and light-transmittance is essentially still present even in oxide semiconductor materials. The problem in metal foil is that the light-transmittance decreases in accordance with increase of the foil thickness, while the problem in oxide semiconductor materials is that the light-transmittance decreases in accordance with increase of the carrier density. Accordingly, the problem to study is only changed from the former to the latter.

As described above, the demand for light-transmitting metal electrodes is expected to keep expanding in the future in many applications, but there are some future problems.

First, there is a fear that indium, which is employed as a material for the electrodes, will be exhausted. Indium is a major component of ITO, which is widely used in the light-transmitting electrodes, and is hence expected to be exhausted in the worldwide range according as the demand for displays typically such as flat panel displays increases rapidly. It is a real fact that there is a shortage of rare metals such as indium, and accordingly the cost of materials has really risen remarkably. Thus, this is a serious problem.

To cope with this problem, for example, in the sputtering process for forming an ITO film, it is studied to reuse even an ITO membrane deposited on the inner wall of vacuum chamber so as to improve the efficiency of ITO target to the utmost limit. However, techniques like that only postpone the exhaustion of indium and they by no means essentially solve the problem. In consideration of that, indium-free light-transmitting electrodes are currently being developed. However, at present, any substitute such as zinc oxide material or tin oxide material is not yet capable of exhibiting properties exceeding ITO.

The second problem is that, if the carrier density is increased to improve electro conductivity of oxide semiconductor material, the reflection in a longer wavelength region is increased to lower the transmittance. The reason for this is as follows.

According to electronic states, substances are classified into two types: some substances have energy gaps, and the others do not. Even when the substances having energy gaps are irradiated with light having energy smaller than the gaps, they do not absorb the light because electrons do not undergo the band transition. Therefore, with respect to visible light in the wavelength region of 380 nm to 780 nm, the substances having energy gaps of more than 3.3 eV are transparent to the light.

On the other hand, depending on the width of the energy gap between the valence band and the conduction band, substances are generally categorized into three types, namely, conductors, semiconductors and insulators. The substances having relatively small band gaps are conductors, and in contrast those having relatively large band gaps are insulators, and those having middle band gaps are semiconductors. Oxide semiconductors, which are assigned to semiconductors, have chemical bonds of strong ionic character and hence generally have large energy gaps. Accordingly, they can readily satisfy the above condition at a shorter wavelength in the visible region, but the transparency at a longer wavelength is liable to lower. Further, in the case where the oxide semiconductors are used in light-transmitting electrodes, carriers of electron drift, namely, carriers of electric current are doped to obtain conductivity and transparency to visible light. For example, ITO consists of $In_2O_3$ containing $SnO_2$ as a dopant. In this way, oxide semiconductors can be made to have low resistivities by increasing the carrier densities. However, according as the carrier density is increased, the electrode layer of oxide semiconductor as a whole becomes exhibiting metallic behavior and consequently the transmittance becomes decreasing from at a longer wavelength. If the transmittance in a visible region becomes lower, the electrode can not work as light-transmitting electrode well. Because of this phenomenon, there is a lower limit to the resistivity of light-transmission electrode made of oxide semiconductor.

In view of this, there are attempts to lower the resistivity of light-transmitting metal electrode. For example, a transparent substrate is coated with a metal mesh electrode having a thickness of not more than 15 μm, a line width of not more than 25 μm and an opening diameter of 50 μm to 2.5 mm. The openings of the mesh are then filled with a transparent resin film. On the composition thus prepared, an ITO film is provided to produce a light-transmitting electrode (see, JP-A-2005-332705 (KOKAI), for example). However, even in this electrode, the metal mesh electrode serves as only an assistant to the ITO film and hence does not solve the above problems.

Because of the aforementioned circumstances, it is desired to provide a light-transmitting metal electrode made of a conductive material which is versatile and inexpensive, which is free from the fear of exhaustion and at the same time which can keep a low resistivity, namely, a high conductivity.

SUMMARY OF THE INVENTION

According to the present invention, there is provided a light-transmitting metal electrode comprising:
a transparent substrate, and
a metal electrode layer having a thickness in the range of not less than 10 nm and not more than 200 nm formed on said substrate, comprising
a metal part hat any pair of point-positions in the part is continuously connected, and
a plurality of openings penetrating through said metal electrode layer having an average diameter in the range of not less than 10 nm and not more than $\frac{1}{3}$ of said wavelength of light, the pitches between the centers of said openings being not less than the average diameter and not more than $\frac{1}{2}$ of said wavelength of light,
wherein 90% or more of said metal part in said metal electrode layer continues linearly without breaks by the openings in a straight length of not more than $\frac{1}{3}$ of the wavelength of visible light to use in 380 nm to 780 nm.

According to the present invention, there is also provided a first process process for preparation of the above electrode, wherein
a phase-separated block-copolymer membrane is formed in the form of a dot pattern of microdomains, and then an etching process is carried out by using said dot pattern of microdomains as a mask to prepare a metal electrode layer comprising openings.

According to the present invention, there is also provided a second process for preparation of the above electrode, comprising the steps of
preparing a transparent substrate,
forming an organic polymer layer on said transparent substrate,
forming an inorganic substance layer on said organic polymer layer,
forming a phase-separated block-copolymer membrane in the form of a dot pattern of microdomains on said inorganic substance layer,
transferring said dot pattern of block-copolymer microdomains onto the organic polymer layer and said inorganic substance layer, so that columnar structures made of said organic polymer and said inorganic substance are formed on the surface of said transparent substrate,
forming a metal layer onto the columnar structures, and
removing said organic polymer.

Still further, according to the present invention, there is provided a displaying device comprising the above light-transmitting metal electrode.

The present invention provides a light-transmitting metal electrode having high transparency while keeping a low resistivity by using a metal as the electroconductive material for the electrode. Since the high transparency of the electrode is given by the particular hyperfine structure, the metal used as the material can be selected from a wide range metals. This means that it is unnecessary to use conventional rare metal oxide materials, and accordingly a versatile and inexpensive light-transmitting metal electrode can be provided. Further, it is also possible to make a breakthrough into the lower limit to resistivities of light-transmitting electrodes made of conventional oxide semiconductors.

BRIEF DESCRIPTION OF THE DRAWINGS

FIG. 1 illustrates an example of a pattern of the light-transmission metal electrode comprising openings.

FIG. 2 is an electron micrograph showing an example of a pattern of the light-transmission metal electrode comprising openings according to one embodiment of the present invention.

FIG. 4 is an electron micrograph showing an example of a pattern of the light-transmission metal electrode comprising openings according to another embodiment of the present invention.

FIG. 5 is a chart showing a transmittance, in the visible region, of the light-transmission metal electrode comprising openings according to one embodiment of the present invention.

DETAILED DESCRIPTION OF THE INVENTION

Figure 3:
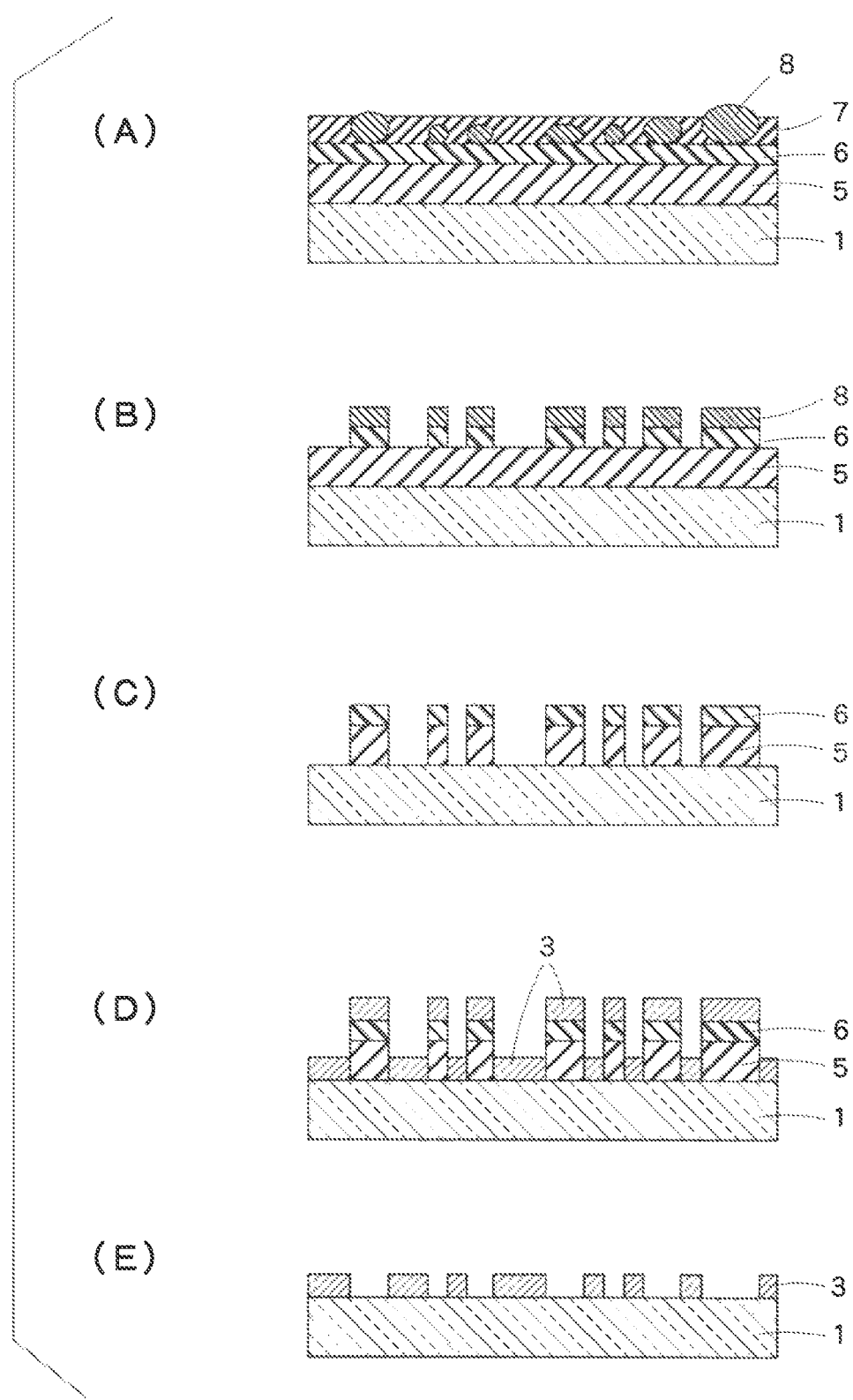
FIG. 3 illustrates an example of the process for preparation of the light-transmission metal electrode comprising openings according to one embodiment of the present invention.

First, with respect to the response of substance irradiated with light, the basic theory is explained below.

Drude theory, which describes movement of free electrons from the viewpoint of classical mechanics, tells us as follows. On the assumption that the mean scattering time of free electrons is much shorter than the period of oscillation of light, the dielectric function $\in(\omega)$ is expressed by the following formula (1):

$$\in(\omega) = \in_b(\omega) - \omega p^2/\omega^2 \qquad (1)$$

wherein
$\omega p = (ne^2/m \times \in_0)^{1/2}$ is a plasma frequency of conduction electrons, and here n is a carrier density, e is an electric charge, m is an effective mass, and $\in_0$ is the permittivity of vacuum. The first term of the formula (1) stands for contribution of the metal dipoles, and is approx. 1, here. The second term stands for contribution of the conduction electrons.

As shown above, the plasma frequency is a function of the carrier density n. In the case of $\omega_0 > \omega$, the dielectric function $\in(\omega)$ gives a negative value and hence the incident light undergoes plasma reflection. On the other hand, in the case of $\omega > \omega_0$, the dielectric function $\in(\omega)$ gives a positive value and hence the light transmits through the substance. Accordingly, the plasma frequency can be regarded as the threshold between reflection and transmittance when the substance responds to light.

A typical metal has a plasma frequency in the ultraviolet region, and hence reflects visible light. For example, silver Ag has a carrier density of approx. $n = 6.9 \times 10^{22}$ ($cm^{-3}$), and the wavelength corresponding to the plasma frequency is positioned at approx. 130 nm in the ultraviolet region.

In contrast, the wavelength corresponding to the plasma frequency of the oxide semiconductor ITO is positioned in the infrared wavelength region. The carrier density is in direct proportion to the electroconductivity and is in inverse proportion to the resistivity. This means that, if the dopant is increased to lower the resistivity, the plasma frequency is increased. Accordingly, when the dopant is increased to reach a particular amount, visible light in a longer wavelength region undergoes the plasma reflection to lower the transmittance.

As described above, in order that the oxide semiconductor material can ensure transparency in the visible region, the wavelength corresponding to the plasma frequency must be positioned in the infrared region. The carrier density, therefore, has an upper limit. For this reason, generally produced ITO has a carrier density of approx. $n = 0.1 \times 10^{22}$ ($cm^{-3}$), which is several percents of those of metals. The lower limit of resistivity derived from the above value is approx. 100 μΩ·cm, and it is essentially impossible to reduce the resistivity more.

Thus, the light-transmitting electrode of oxide semiconductor like ITO has a theoretical lower limit to the resistivity. However, as the electronics technology is developed, particularly, as mobile instruments equipped with displays such as cellular phones and notebook-size PCs are developed, it is evidently getting required to reduce the resistivity of light-transmitting electrode so as to prevent the electric power consumption from increasing. In spite of that, it is difficult to overcome the above trade-off relationship by only the conventional technology.

In consideration of the aforementioned problem, the present invention is thought out.

The light-transmitting metal electrode and the process for preparation thereof according to the present invention are explained below in detail with the attached drawings referred to.

First, the theoretical bases of the present invention are described below.

FIG. 1 shows one embodiment of the light-transmitting metal electrode according to the present invention. FIG. 1(A) is a sketch of the light-transmitting metal electrode, and FIG. 1(B) is an elevation thereof. The light-transmitting metal electrode comprises a smooth and transparent substrate 1 and a metal electrode layer 2 provided thereon. The metal electrode layer 2 comprises a metal part 3 and fine openings 4 penetrating through the metal part. The metal electrode layer 2 can function as an electrode and at the same time can work as light-transmitting layer in the visible wavelength region.

The light-transmission metal electrode according to the present invention is characterized in that the transparency is more than expected from the total area occupied by the openings 4 in the metal electrode layer, and in other words, is characterized in that the reflection essentially ascribed to the metal part is fundamentally reduced to transmit light.

The above metal electrode layer has openings much smaller than the wavelength of light incident on the electrode, and thereby can serve as a light-transmitting electrode although made of a metal. There are roughly two reasons for this. One is that, when the electrode is exposed to light, movement of free electrons induced by the electric field of the light is inhibited since the metal part continues linearly without breaks by the openings in a straight length of not more than ⅓ of the wavelength of light. Consequently, the electrode is transparent to the light. The other is that, since the openings have diameters much smaller than the wavelength of light, effects of Rayleigh scattering and diffraction are reduced to keep straightforwardness of the light.

Here, the term "wavelength of light" means a wavelength of light incident on the light-transmission electrode when the electrode is used. Accordingly, the wavelength can be selected in a wide range, but is in the visible wavelength region of 380 nm to 780 nm (see, for example, "KAGAKU JITEN (dictionary of chemistry, written in Japanese)", published by Tokyo Kagaku Dozin Co., Ltd.). In order to ensure a satisfying transmittance of the electrode, the transparent substrate has a transmittance of preferably 80% or more, more preferably 90% or more. The above term "straight length" means the maximum straight distance between two point-positions not separated by the openings in any area on the electrode surface.

The first theoretical basis is then described below. The Drude theory described above is based on the assumption that the object substance is homogeneous and sufficiently large as compared with the wavelength of incident light. When light having a frequency lower than the plasma frequency is applied to the substance, free electrons in the substance are polarized by the electric field of the light. The polarization is induced in such direction that the electric field of light may be cancelled. The electric field of light is thus shielded by the induced polarization of electrons, so that the light does not penetrate into the substance and thus, what is called, "plasma reflection" is observed.

If the substance in which electrons are induced to be polarized is sufficiently small as compared with the wavelength of light, it is thought that the movement of electrons is restricted by the geometrical structure and, as a result, that the electric field of light cannot be shielded.

As described above, in the present invention, the response of substance to light is considered from the viewpoint of inhabitation of free electron movement by a hyperfine structure, and thereby the structure isometrically transmitting the electric field of light, as shown in FIG. 1, is proposed. The inventors have been studied that structure in detail. As a result, it is found that the electrode comprising an electrode layer composed of a metal part and openings, as a whole, can transmit all directions of polarized light if the metal part continues linearly without breaks by the openings in a straight length of not more than ⅓, preferably not more than ⅕ of the wavelength of incident light. On the other hand, any pair of point-positions in the metal part is continuously connected. In other words, the metal part as a whole continues although the openings are provided therein, and thereby the function as an electrode is ensured while the resistivity is enough reduced, according to the volume ratio of the openings, to keep a relatively high electro conductivity.

It has been hitherto very difficult to produce completely evenly the above structure, in which the metal part continues linearly in a straight length of not more than ⅓ of the wavelength of light, on the whole metal layer. However, the inventors have found that, only if 90% or more, preferably 95% or more of the whole metal layer has the structure in which the metal part continues linearly in a straight length of not more than ⅓ of the wavelength of light, the transparency to light is kept to achieve the object of the present invention.

The above description is based on the assumption that incident light comes perpendicularly to the surface of the electrode, but the light-transmitting metal electrode functions not only to perpendicularly incident light but also to obliquely incident light. Even in the case of obliquely incident light, the light also cannot penetrate into the metal although the movement of free electrons is geometrically inhibited in a longer apparent distance as compared with that in the case of perpendicularly incident light. When a metal is irradiated with light, the "skin-depth" is defined as the distance over which the penetrating light falls to 1/e (wherein "e" is a base of natural logarithms) of its original strength. The skin depth of obliquely incident light is only several nanometers. Accordingly, even in the case of obliquely incident light, the light-transmitting metal electrode also functions well.

For analyzing and confirming that the above structure is formed in the metal electrode layer, the following method can be adopted. An electron or atomic force micrograph of the observed layer surface is subjected to Fourier transform, and the correlation wavelength and the correlation function are plotted on X- and Y-axes, respectively. The correlation function plotted on Y-axis indicates periodicity of the continuous structure. That is to say, it indicates how much the structure imaged in the micrograph contains moieties having the repeating unit of a particular wavelength. The threshold of the correlation wavelength is determined at ⅓ of the wavelength of light, and then the integrated value of the correlation function in the range of more than the threshold and that in the whole wavelength region are calculated and compared. If the ratio of the former per the latter is 100% or less, it can be considered that 90% or more of the whole surface of the metal electrode layer continues linearly in a straight length of not more than ⅓ of the wavelength of light.

The second theoretical basis, which concerns straightforwardness of light maintained by reduction of scattering effects and by avoidance of diffraction, is then described below.

The present invention is aimed to reduce scattering effects and thereby to improve the efficiency of straightforwardness of light, and hence it is necessary to treat sizes perturbing the incident light as parameters when the surface structure is defined. From this viewpoint, it is found that the diameter of the opening is most properly determined by the radius of gyration of the opening structure and thereby that the efficiency of straightforwardness of light can be most properly represented. That is to say, the radius of the opening in the surface structure according to the present invention is defined as its radius of gyration, and accordingly the diameter is double the radius of gyration. Even if the openings have different shapes, the same effect of the invention can be obtained as long as the radii of gyration are the same.

In the present invention, the radius of gyration of the opening is defined as follows. On an image of the opening, circular lines at equal intervals are drawn from the edge. In concrete, on a relief image obtained by atomic force microscopy, circular lines at equal intervals are drawn from the edge. The thus-obtained lines are image-processed to obtain the center of gravity. The distance from the center of gravity to the concavity is then determined, and is processed together with the moment to calculate the radius of gyration R. The radius of gyration can be also obtained by Fourier transform of the electron or atomic force micrograph.

The larger the surface structure is, the more light is scattered. The effect of light-scattering is in proportion to the square of the size. Accordingly, the average radius of gyration R of the openings is preferably not more than ⅙ of the wavelength of incident light. That is to say, the average diameter of the openings is preferably not more than ⅓ of the wavelength of incident light. If the average radius of gyration R is larger than that, Rayleigh scattering is liable to occur and the light immediately loses straightforwardness. The diameter of the openings is more preferably not more than ⅕, further preferably not more than ⅒ of the wavelength of light. As long as the above conditions are satisfied, the shapes of the openings are not particularly restricted. Examples of the opening shapes include cylindrical shape, conical shape, triangular pyramidal shape, quadrilateral pyramidal shape, and other columnar or pyramidal shapes. And two or more shapes may be mixed. Even if the light-transmitting metal electrode according to the present invention contains various sizes of openings, the effect of the invention can be obtained. It is, on the contrary, rather preferred that the openings have various sizes because the metal part with those openings is apt to continue linearly in a relatively short straight length. In the case like the above, where the openings have various sizes, the diameters of the openings can be represented by the average.

Diffraction of light incident on the light-transmitting metal electrode according to the present invention is then described below. When light penetrates from the transparent substrate-side to the metal layer-side, the scalar theory tells us as follows. On the assumption that the metal layer-side is regarded as an air layer and that the electrode is regarded as a linear diffraction grating, the condition for causing diffraction is expressed by the following formula (2):

$$\sin \theta_m - n \sin \theta_1 = m \times \lambda / d \qquad (2)$$

wherein
$\theta_m$ is an emission angle, $\theta_1$ is an incident angle on the transparent substrate-side, $\lambda$ is a wavelength of incident light, d is an interval of diffraction grating, m is a diffraction order of integer (m=0, ±1, ±2 . . . ), and n is a refractive index of the transparent substrate. Accordingly, the condition for not causing diffraction is that the formula (2) does not have a solution when the diffraction order is the minimum: m=−1. This means that the condition is $\lambda/n<1$, and hence the ratio of the wavelength of light per the refractive index of the transparent substrate is the threshold. The refractive index of transparent substrate used generally is not more than 2.0, and therefore the diffraction can be avoided if the openings in the present invention are arranged at such intervals that pitches between the centers of the openings are not more than ½ of the wavelength of incident light.

Preferably, the relative positions of the openings are arranged at random, namely, isometrically. According to the first theoretical basis, the reason for this can be explained as follows. For example, if the openings are arranged in hexagonal symmetry, the metal part has areas periodically continued in tri-axial directions and therefore it is thought that the openings cannot inhibit the movement of free electrons isometrically.

For analyzing and confirming whether the openings are arranged isometrically or not, the following method can be adopted. For example, an electron or atomic force micrograph of the metal layer having the openings is subjected to two-dimensional Fourier transform to obtain, what is called, a "reciprocal space image". If the relative arrangement of the openings has periodicity, there are clear spots corresponding to the packing arrangement in the reciprocal space image. In contrast, if the openings are relatively positioned isometrically in completely random arrangement, a ring shape is observed instead of the spots.

In the case where EB (electron beam) lithography system or exposure system is used to fabricate the openings, it is easy to produce a long-periodical structure having regular arrangement but it is difficult to produce a structure having the openings arranged randomly. On the other hand, in the present invention, a phase-separated form of block-copolymer is used as a template. The block-copolymer in the phase-separated form gives openings relatively positioned isometrically in random arrangement, and hence is suitable for manufacturing the light-transmitting metal electrode according to the present invention.

The following description is based on the result that a metal electrode having fine openings was fabricated and measured in practice. The electrode must comprise the metal part which continues linearly without breaks by the openings in a straight length of not more than ⅓ of the wavelength of light. However, from the viewpoint of microfabrication, the openings preferably have an average diameter of 10 nm or more. If the average diameter is smaller than that, it is often difficult to fabricate a light-transmitting metal electrode excellent in transparency.

FIG. 2 is an electron micrograph showing a top surface of the light-transmitting metal electrode comprising openings according to one practical embodiment. The light-transmitting metal electrode comprising these openings was formed by aluminum vapor-deposition and lift-off process in which a diblock-copolymer membrane was used as a template of the openings. The process according to the present invention can give a large pattern having openings of 100 nm or less, which cannot be obtained yet according to conventional photo or electron beam lithographic processes. Needless to say, if the photo or electron beam lithographic processes are improved to produce the similar structure in the future, it can have the same function as the light-transmission metal electrode according to the present invention.

In the present embodiment, diblock copolymer mainly comprising aromatic polymer and acryl polymer in combination was used. As described below, however, the combination is not restricted as long as one component of the diblock copolymer can be selectively removed. Further, the method in which nanoparticles are also used as the template (JP-2005-279807 (KOKAI)), the in-printing process in which polymer or metal having fine convexes and concaves is used as a stamp to transfer a relief image, and an EB (electron beam) lithographic system can be also adopted.

The reason why the diblock copolymer of aromatic polymer and acryl polymer in combination was used in the present embodiment is that these two polymers have large difference in reactive ion etching (hereinafter, referred to as RIE) rate. The theoretical basis thereof is disclosed in U.S. Pat. No. 6,565,763. Examples of the aromatic polymer include polystyrene, polyvinyl naphthalene, polyhydroxystyrene, and derivatives thereof. Examples of the acryl polymer include polyalkylmethacrylates such as polymethylmethacrylate, polybutylmethacrylate and polyhexylmethacrylate; polyphenylmethacrylate, polycyclohexylmethacrylate and derivatives thereof. Instead of these methacrylates, acrylates can be used to obtain the same effects. Among the above, diblock polymer of polystyrene and polymethylmethacrylate is preferred because it can be easily synthesized and it is easy to control the molecular weight of each component polymer.

In order to use the diblock copolymer as a template in the present invention, it is necessary that blocks in the copolymer form sufficiently self-assembled dot-shaped domains in nano-scale. Accordingly, from the morphological viewpoint, it is most preferred that the block copolymer in bulk have dot-structures.

The self-assembled block copolymer is by no means automatically aligned in the desired arrangement. Patterns in a short range are aligned in the same direction to form grains. The block copolymer is subjected to thermal annealing at a temperature higher than the glass transition point of the block polymer, and thereby the gains grow gradually. It is already reported by the past study (C. Harrison, et. al., Physical Review E, 66, 011706 (2002)) that the growing rate is in proportion to the ¼ power of the growing time. This means that annealing for only several hours is enough for the aligned grains to grow to be several microns long.

The inventors have found a methods and conditions to obtain a block-copolymer in the phase-separated form of a dot pattern having a period of 50 to 70 nm. The aligned dot pattern is transferred to the substrate by the process described below. A metal electrode is deposited onto the transferred structure, and then the area of the transferred pattern is removed to obtain a light-transmitting metal electrode.

In the present invention, metals constituting the electrode are desirably selected. Here, the term "metals" means materials which are conductors as simple substances, which exhibit metallic gloss, which have malleability, which are in the form of solid at room temperature and which consist of metal elements, or alloys thereof. In one practical embodiment, the material constituting the electrode preferably has a plasma frequency higher than the frequency $\omega$ of incident light. In addition, it is also preferred to have no absorption in the wavelength region of light to use. Examples of the preferred materials satisfying those conditions include aluminum, silver, platinum, nickel, cobalt, gold, copper, rhodium, palladium, and chromium. Among those, aluminum, silver, platinum, nickel and cobalt are more preferred. However, the metal material is not restricted by those examples as long as it has a plasma frequency higher than the frequency of incident light. As described above, the present invention is advantageous in that it is unnecessary to use a rare metal such as indium and in that typical metals can be employed.

In the present invention, it is necessary to produce a pattern in higher resolution than the limiting resolution of generally used lithography. To produce the pattern of very high resolution, it is preferred to adopt a lithographic process using a block polymer as an etching mask.

One example of the above process is explained below with FIG. 3 referred to.

First, a transparent substrate 1 is prepared. If necessary, an organic polymer layer 5 is coated thereon in a thickness of 50 to 150 nm. The organic polymer layer 5 is preferably provided so as to improve the aspect ratio of mask pattern in etching the substrate.

Secondly, on the organic polymer layer, an inorganic substance layer 6 is coated or deposited in a thickness of 5 to 30 nm. The inorganic substance layer 6 functions as an etching mask when the underlying organic polymer layer 5 is subjected to oxygen plasma etching. The organic polymer layer 5 is easily engraved by the oxygen plasma etching, but the inorganic substance layer 6 can have strong resistance against the oxygen plasma etching if proper inorganic substance is selected as the material thereof.

Finally, a block-copolymer membrane 7 is spin-coated on the inorganic layer to obtain a composition to be etched. A diblock copolymer is spin-coated, and then is subjected to thermal annealing on a hot plate or in an oven to form dot-shaped microdomains 8 (FIG. 3(A)). After the block copolymer is aligned, if one polymer component is easily removed by etching, the nanoscale domains 8 of the aligned and remaining other polymer component can be used as an etching mask. In view of this, a diblock copolymer of aromatic polymer and acryl polymer in combination is preferred since these two blocks give large etching contrast. For example, polystyrene and polymethylmethacrylate have very different RIE rates, and hence domains of aligned polystyrene can be selectively made to remain to use as an etching mask for following process.

After one phase of the block copolymer is selectively removed to form a dot pattern, the underlying layers are subjected to etching by using the dot pattern as a mask. However, typical polymers constituting the block copolymer have insufficient durability to resist the etching applied to the hard substrate. To overcome this problem, the present embodiment adopts a pattern transfer method using the inorganic substance layer 6 so that the pattern can have enough aspect ratio to work as a mask. In the etching process, gases are so properly selected that the inorganic substance and the organic substance including the polymer can have very different etching rates. In the present embodiment, an etching process of RIE with oxygen gas was carried out. The inorganic substance layer was not etched by oxygen plasma, and hence the etching contrast between the inorganic substance layer and the underlying organic polymer layer 5 was very large. As a result, the organic polymer layer 5 was rapidly engraved to obtain a dot pattern of high aspect ratio (FIG. 3(C)).

After the dot pattern is transferred to the organic polymer layer 5 (FIG. 3(C)), the metal electrode layer 9 is provided (FIG. 3(D)). For forming the metal electrode layer 9, a metal can be accumulated by, for example, a vapor-deposition process. As described above, in order to use as a material for the light-transmitting metal electrode, the metal is prefer required to have a plasma frequency higher than the frequency of light to transmit. The material for the light-transmitting metal electrode often contains impurities such as oxygen, nitrogen and water. Even in that case, if having a plasma frequency higher than the frequency of light, the material can transmit the light. After the metal is accumulated, the polymer is removed to obtain the light-transmitting metal electrode according to one embodiment of the present invention, as shown in FIG. 3(E).

Materials employable in the present invention are described below in detail.

Examples of the materials for the transparent substrate include amorphous quartz ($SiO_2$), Pyrex glass, fused silica, artificial fluorite, soda glass, potassium glass, and tungsten glass. The organic polymer is used for a mask pattern when the metal electrode layer is deposited on the substrate. It is, therefore, preferred that the polymer can be easily removed by liquid remover, ultrasonic treatment, ashing, or oxygen plasma. That is to say, the polymer preferably consists of organic substances only. Examples of the preferred organic polymer include polyhydroxylstyrene, novolac resin, polyimide, cycloolefin polymer, and copolymers thereof.

The inorganic substance layer serves as an etching mask when the underlying organic polymer layer is subjected to etching, for example, oxygen plasma etching. In consideration of this, examples of the materials for the inorganic substance layer include deposited silicon, silicon nitride and silicon oxide. Further, spin-coated siloxene polymer, polysilane and spin-on glass are also advantageous materials if oxygen plasma etching is adopted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

Example 1

First, a visible light-transmitting metal electrode was produced.

The inventors have found a method to obtain a block-copolymer in the phase-separated form of a dot pattern having a period of 50 to 70 nm. The aligned dot pattern is transferred to the substrate by the process described below. A metal electrode is deposited onto the transferred structure, and then the area of the transferred structure is removed to obtain a light-transmitting metal electrode. The process is as follows.

A thermosetting resist (THMR IP3250 [trademark], manufactured by Tokyo Ohka Kogyou Co., Ltd.) was diluted with ethyl lactate by 1:3. The solution was spin-coated at 2000 rpm for 30 seconds on a 4-inch amorphous quartz wafer (Photomask Substrate AQ [trademark], manufactured by Asahi Glass Co., Ltd.), and then heated on a hot-plate at 110° C. for 90 seconds, and further heated at 250° C. for 1 hour in an oxidation-free inert oven under nitrogen gas-atmosphere to perform a thermosetting reaction. The layer thus formed had a thickness of approx. 80 nm.

Spin-on glass (SOG-5500 [trademark], manufactured by Tokyo Ohka Kogyou Co., Ltd.) was diluted with ethyl lactate by 1:5. The solution was spin-coated at 3000 rpm for 30 seconds on the above resist-coated substrate, and then heated on a hot-plate at 110° C. for 90 seconds, and further heated at 250° C. for 1 hour in an oxidation-free inert oven under nitrogen gas-atmosphere. The layer thus formed had a thickness of approx. 20 nm.

Thereafter, 3 wt. % propylene glycol monomethyl ether acetate solution of polystyrene-polymethylmethacrylate diblock copolymer and 3 wt. % propylene glycol monomethyl ether acetate solution of polymethylmethacrylate homopolymer were mixed in a ratio of 6:4. The mixture was filtered through a 0.2 μm mesh to obtain a diblock copolymer solution. The solution was spin-coated at 2000 rpm for 30 seconds on the above substrate. And then heated on a hot-plate at 110° C. for 90 seconds, and further heated at 250° C. for 8 hour in an oxidation-free inert oven under nitrogen gas-atmosphere to perform phase-separation. In the diblock copolymer, the polystyrene moiety had a molecular weight of 78000 g/mol and the polymethylmethacrylate moiety had a molecular weight of 170000 g/mol. The thus-obtained copolymer had a morphology in which microdomains of polystyrene in the form of dots having diameters of approx. 50 to 70 nm were dispersed in a matrix of polymethylmethacrylate. The thus-obtained block copolymer layer had a thickness of 50 nm.

The diblock copolymer layer was subjected to etching for 8 seconds under the conditions of $O_2$: 30 sccm, 100 mTorr and a RF power of 100 W. In this process, the matrix of polymethylmethacrylate in the block copolymer was selectively removed, but the polystyrene was not etched. The etching process was carried out under such conditions that polymethylmethacrylate among the dots of polystyrene was completely etched. As a result, the spin-on glass layer in the etched area was completely bared. The remaining polystyrene was then used as a mask while the spin-on glass layer was subjected to etching of $CF_4$-RIE for 60 seconds under the conditions of $CF_4$: 30 sccm, 10 mTorr and a RF power of 100 W. In this etching process, the spin-on glass layer in the area where the matrix of polymethylmethacrylate had been positioned was selectively etched, so that the dot pattern of polystyrene was transferred to the spin-on glass layer. Thereafter, the spin-on glass layer was used as a mask while the underlying thermosetting resist layer was subjected to etching of $O_2$-RIE for 90 seconds under the conditions of $O_2$: 30 sccm, 10 mTorr and a RF power of 100 W. As a result, columnar structures having high aspect ratios were formed in the area where polystyrene domains had been positioned, to obtain a pattern of columns.

Onto the pattern of columns thus-obtained, aluminum was deposited in a thickness of 30 nm by the resistance heat deposition method. And then, Aluminum deposited structure wac subjected to ashing for 60 sec under the condition of $O_2$: 30 sccm, 10 mTorr and a RF power of 100 W. The pattern was then immersed in water and ultrasonically washed to remove, namely, to lift off the columnar structures. Thus, a light-transmitting ssion metal electrode having desired openings was obtained.

The thus-produced light-transmitting metal electrode had openings having an average diameter of approx. 100 nm, and the openings occupied approx. 32% of the whole area. The metal part continuing in 180 nm or less occupied 96% of the whole area under the condition that light at 550 nm, which gives the highest luminosity, was used. The transmittance at 550 nm was approx. 45%. The resistivity was approx. 30 $\mu\Omega\cdot cm$.

Finally, distribution of light scattered by the light-transmitting metal electrode was observed. The produced light-transmitting metal electrode was cut into pieces of approx. 5 mm×5 mm. A red He—Ne laser beam of approx. 638 nm was then applied onto one of the pieces placed 50 cm apart from the laser, and two-dimensional distribution of the transmitted light was projected onto a screen placed 1 m apart from the piece. As a result, any clear spot except the center spot was not observed, and hence it was found that the light was scarcely scattered.

Comparative Example 1

A metal electrode for comparison with Example 1 was produced. The openings of the comparative electrode occupied areas in the same ratio as those in Example 1, but the average diameter was approx. 5 μm, which was approx. 100 times as large as that in Example 1. In the process for preparation, a 4-inch amorphous quartz wafer was coated with the photo-sensitive resist to form a mask having openings of approx. 5 μm, through which the wafer was exposed to light in an exposing system. The exposed wafer was developed to form a pattern of columns, and then aluminum was deposited thereon in a thickness of approx. 30 nm. Thereafter, the mask of photo-sensitive resist was removed. The transmittance at 550 nm of the obtained metal electrode was measured and found to be approx. 32%. The resistivity was approx. 30 μΩ·cm.

The distribution of light scattered by the metal electrode produced in Comparative Example 1 was observed in the same manner as that in Example 1. As a result, spots in the form of rings were observed at the position sifted at approx. 5 degrees from the center spot, and hence it was found that light was scattered more than in Example 1.

Example 2

Secondly, another light-transmitting ssion metal electrode was produced. The openings of the produced electrode occupied areas in a smaller ratio than those in Example 1 The light-transmitting metal electrode comprising openings in smaller area can be produced if the block polymer in Example 1 is etched for a longer time. The process for preparation of the light-transmitting metal electrode having that structure is described below in detail.

A thermosetting resist (THMR IP3250 [trademark], manufactured by Tokyo Ohka Kogyou Co., Ltd.) was diluted with ethyl lactate by 1:3. The solution was spin-coated at 2000 rpm for 30 seconds on a 4-inch amorphous quartz wafer (Photomask Substrate AQ [trademark], manufactured by Asahi Glass Co., Ltd.), and then heated on a hot-plate at 110° C. for 90 seconds, and further heated at 250° C. for 1 hour in an oxidation-free inert oven under nitrogen gas-atmosphere to perform a thermosetting reaction. The layer thus formed had a thickness of approx. 80 nm.

Spin-on glass (OCD T-7 5500-T [trademark], manufactured by Tokyo Ohka Kogyou Co., Ltd.) was diluted with ethyl lactate by 1:5. The solution was spin-coated at 3000 rpm for 30 seconds on the above resist-coated substrate, and then heated on a hot-plate at 110° C. for 90 seconds, and further heated at 250° C. for 1 hour in an oxidation-free inert oven under nitrogen gas-atmosphere. The layer thus formed had a thickness of approx. 20 nm.

Thereafter, 3 wt. % propylene glycol monomethyl ether acetate solution of polystyrene-polymethylmethacrylate diblock copolymer and 3 wt. % propylene glycol monomethyl ether acetate solution of polymethylmethacrylate homopolymer were mixed in a ratio of 6:4. The mixture was filtered through a 0.2 am mesh to obtain a diblock copolymer solution. The solution was spin-coated at 2000 rpm for 30 seconds on the above substrate. And then heated on a hot-plate at 110° C. for 90 seconds, and further heated at 250° C. for 8 hour in an oxidation-free inert oven under nitrogen gas-atmosphere to perform phase-separation. In the diblock copolymer moiety, the polystyrene moiety had a molecular weight of 54000 g/mol and the polymethylmethacrylate moiety had a molecular weight of 120000 g/mol. The thus-obtained block copolymer layer had a thickness of 50 nm.

The diblock copolymer layer was subjected to etching for 10 seconds under the conditions of $O_2$: 30 sccm, 100 mTorr and a RF power of 100 W. The remaining polystyrene was then used as a mask while the spin-on glass layer was subjected to etching of $CF_4$-RIE for 60 seconds under the conditions of $CF_4$: 30 sccm, 10 mtorr and a RF power of 100 W. Thereafter, the spin-on glass layer was used as a mask while the thermosetting resist layer was subjected to etching of $O_2$-RIE for 90 seconds under the conditions of $O_2$: 30 sccm, 10 mtorr and a RF power of 100 W. As a result, columnar structures of high aspect ratios were formed in the area where polystyrene domains had been positioned, to obtain a pattern of columns.

Onto the pattern of columns thus-obtained, aluminum was deposited in a thickness of 30 nm by the resistance heat deposition method. And then, Aluminum deposited structure wac subjected to ashing for 60 sec under the condition of $O_2$: 30 sccm, 10 mTorr and a RF power of 100 W. The pattern was then immersed in water and ultrasonically washed to remove, namely, to lift off the columnar structures. Thus, a light-transmission metal electrode having desired openings was obtained. The light-transmitting metal electrode was observed through the electron microscopy, and the result was shown in FIG. 4.

The produced light-transmitting metal electrode had openings having an average diameter of approx. 50 nm, and the openings occupied approx. 15% of the whole area. The transmittance of the metal electrode in the visible region was measured, and the result was shown in FIG. 5. As shown in FIG. 5, the transmittance was higher than the area ratio of the openings at any wavelength. The reason why the transmittance gradually increased in the shorter wavelength range is presumed to be ascribed to the property of aluminum, which is that the transmittance becomes higher according as the wavelength approaches the plasma frequency. As is evident from FIG. 4, the metal part continued linearly in a very short straight length because the openings had irregular shapes. This is thought to be the reason why the transmittance in the whole visible wavelength region was higher than the area ratio of the openings, which was only 15%, as expected from the effect of the present invention. The resistivity of this light-transmission metal electrode was approx. 50 μΩ·cm.

The invention claimed is:
1. A light-transmitting metal electrode comprising:
   a transparent substrate, and
   a metal electrode layer having a thickness in the range of not less than 10 nm and not more than 200 nm formed on said substrate, comprising
      a metal part that any pair of point-positions in the part is continuously connected, and
      a plurality of openings penetrating through said metal electrode layer, having an average diameter in the range of not less than 10 nm and not more than ⅓ of said wavelength of light, the pitches between the centers of said openings being not less than the average diameter and not more than ½ of said wavelength of light,
   wherein 90% or more of said metal part in said metal electrode layer continues linearly without breaks by the openings in a straight length between the adjoining openings of not more than ⅓ of the wavelength of light to use in 380 nm to 780 nm.

2. The electrode according to claim 1, wherein said metal electrode layer exhibit that the transmittance of light is higher than the area ratio of said openings.

3. The electrode according to claim 1, wherein said metal electrode layer is made of a metal selected from the group consisting of aluminum, silver, platinum, nickel and cobalt.

4. The electrode according to claim 1, wherein said openings are randomly arranged in said metal electrode layer.

5. A displaying device comprising the electrode according to claim 1.

6. A light-transmitting metal electrode comprising a metal electrode layer having a thickness in the range of not less than 10 nm and not more than 200 nm formed on said substrate, comprising
    a metal part that any pair of point-positions in the part is continuously connected, and
    a plurality of openings penetrating through said metal electrode layer, having an average diameter in the range of not less than 10 nm and not more than ⅓ of said wavelength of light, the pitches between the centers of said openings being not less than the average diameter and not more than ½ of said wavelength of light,
    wherein 90% or more of said metal part in said metal electrode layer continues linearly without breaks by the openings in a straight length between the adjoining openings of not more than ⅓ of the wavelength of light to use in 380 nm to 780 nm.

7. The electrode according to claim 6, wherein said metal electrode layer exhibit that the transmittance of light is higher than the area ratio of said openings.

8. The electrode according to claim 6, wherein said metal electrode layer is made of a metal selected from the group consisting of aluminum, silver, platinum, nickel and cobalt.

9. The electrode according to claim 6, wherein said openings are randomly arranged in said metal electrode layer.

10. A displaying device comprising the electrode according to claim 6.

* * * * *